(12) United States Patent
Huang

(10) Patent No.: US 6,390,379 B1
(45) Date of Patent: May 21, 2002

(54) METHOD AND DEVICE FOR CONTROLLING REVOLVING SPEED OF HEAT-DISSIPATING FAN

(75) Inventor: Te-Hsun Huang, Jubei (TW)

(73) Assignee: Winbond Electronics Corporation, Hsinchu (TW)

( * ) Notice: Subject to any disclaimer, the term of this patent is extended or adjusted under 35 U.S.C. 154(b) by 0 days.

(21) Appl. No.: 09/603,716

(22) Filed: Jun. 27, 2000

(30) Foreign Application Priority Data

Jul. 19, 1999 (TW) ........................................ 88112247 A

(51) Int. Cl.[7] .................................................. F24F 7/00
(52) U.S. Cl. .................................. 236/49.3; 236/DIG. 9
(58) Field of Search ........................... 236/49.3, DIG. 9, 236/35; 165/80.3; 62/259.2; 361/694, 687, 695; 454/184

(56) References Cited

U.S. PATENT DOCUMENTS 4,174,065 A * 11/1979 Knauth ..................... 236/35 X
5,249,741 A * 10/1993 Bistline et al. ............. 236/49.3
5,906,315 A *  5/1999 Lewis et al. ................ 236/49.3

FOREIGN PATENT DOCUMENTS

JP          63-99912         6/1988
JP         01-226011         9/1989

* cited by examiner

Primary Examiner—Harry B. Tanner

(57) ABSTRACT

A method and a device for controlling the revolving speed of a heat-dissipating fan according to a current temperature of an electronic apparatus in operation, to which the fan is applied, is disclosed. By controlling the revolving speed of the heat-dissipating fan, the heat generated during the operation of the electronic apparatus can be efficiently dissipated. The control of the revolving speed of the fan is performed by adjusting an electric power supplied to the fan whenever the operational temperature of the electronic apparatus is beyond an extent.

23 Claims, 7 Drawing Sheets

METHOD AND DEVICE FOR CONTROLLING REVOLVING SPEED OF HEAT-DISSIPATING FAN

FIELD OF THE INVENTION

The present invention is related to a method for controlling the revolving speed of a heat-dissipating fan, and particularly to a method for controlling the revolving speed of a fan for efficiently dissipating heat from an electronic apparatus to which the fan is applied. The present invention is also related to a device for controlling the revolving speed of a heat-dissipating fan.

BACKGROUND OF THE INVENTION

Nowadays, an electronic apparatus becomes more and more compact due to the enhanced manufacturing techniques. Along with the reduction in size, there is likely to be a problem in heat-dissipation. Therefore, much attention is paid to the development and improvement on efficient heat-dissipating devices.

For an electronic apparatus equipped with a microprocessor, for example a personal computer, a fan with a two-stage controlling mode is conventionally used for performing heat dissipation. The two controlling stages of the heat-dissipating fan include revolution at full speed and suspension of revolution. The former is performed for quick heat dissipation when a heat-dissipating operation is required, and the latter is selected for economizing electricity and reducing noise when no heat-dissipating operation is necessary. Obviously, such control means for heat dissipation is quite inflexible.

SUMMARY OF THE INVENTION

An object of the present invention is to provide a method and a device for controlling the revolving speed of a heat-dissipating fan in order to properly regulate the power of the fan according to the thermal situation of an electronic apparatus in which the fan is used.

The present invention is related to a method and a device for controlling a revolving speed of a heat-dissipating fan. The fan is mounted to an electronic apparatus and revolving for dissipating heat generated during the operation of the electronic apparatus.

The method according to the present invention includes a data-input step, a temperature-measuring step, a temperature-comparing step, and a selective signal-output step. Preferably, the temperature-measuring step, the temperature-comparing step, and the selective signal-output step are repeated at predetermined intervals.

The data-input step is carried out by predetermining a target A temperature and a tolerance value.

The temperature-measuring step is carried out by measuring a current temperature of the electronic apparatus in operation.

The temperature-comparing step is carried out by comparing the current temperature with the target temperature.

The selective signal-output step is carried out by outputting a triggering signal to change the revolution of the fan when a difference between the current temperature and the target temperature is greater than the tolerance value. For example, the selective signal-output step can be performed by triggering an increase of an electric power supplied to the fan so as to speed up the revolution of the fan when the current temperature is less than the target temperature at least by the tolerance value, and/or triggering a decrease of the electric power supplied to the fan so as to speed down the revolution of the fan when the current temperature is greater than the target temperature at least by the tolerance value. Furthermore, the increase and the decrease of the electric power can be achieved by changing a duty cycle of a voltage signal supplied to the fan. Alternatively, they can be achieved by changing a level of a voltage supplied to the fan.

Preferably, a learning procedure is performed in advance to determine an actuating value and/or a suspending value of the electric power to actuate the revolution of the fan. By the previous determination of the actuating and/or the suspending values of the electric power, the present invention is adapted to be used with different kinds of fans which are actuated and/or suspended by different electric powers. In addition, the fan can be quickly actuated and/or stopped to improve dissipating efficiency and/or economize electricity thereby.

The learning procedure for determining the actuating value of the electric power can be performed by the following steps. An electric power is provided for the fan in a motionless state. The electric power is intermittently stepped up to revolve the fan. A revolving speed of the fan is detected at each power-change step. Then, a first threshold value of the electric power making the revolving speed of the fan exceed a first given value is determined as the actuating value.

On the other hand, the learning procedure for determining the suspending value of the electric power includes the following steps. the electric power provided for the fan in a motional state is intermittently stepped down. A revolving speed of the fan is detected at each power-change step. Then, a second threshold value of the electric power making the revolving speed of the fan lower than a second given value is determined as the suspending value.

A device according to a third aspect of the present invention includes a temperature sensor, a temperature comparator, and a power supply.

The temperature sensor, e.g. a thermistor, a transistor, or a thermal diode, is used for measuring a current temperature of the electronic apparatus in operation.

The temperature comparator electrically is connected to the thermometer for comparing the current temperature with a predetermined target temperature, and outputting a triggering signal if the current temperature is beyond a tolerance value from the predetermined target temperature.

The power supply is electrically connected to the temperature comparator and the fan for providing an electric power for the fan to make the fan revolve, and changing a value of the electric power in response to the triggering signal to regulate a revolving speed of the fan.

Preferably, the device further includes a memorizing device such as a memory or registers for storing therein the predetermined target temperature and the tolerance value.

The device preferably further includes a revolving-speed comparator for comparing revolving speeds of the fan detected under different electric powers in a learning procedure to determine an actuating value and/or a suspending value of the electric power to actuate and/or stop the revolution of the fan, respectively.

Preferably, the device further includes a memorizing device such as a memory or registers for storing therein the predetermined target temperature, the tolerance value, the actuating value and the suspending value.

In a preferred embodiment of the present device, the power supply is a pulse-width-modulation (PWM) voltage supply, by which a voltage signal is provided to revolve the fan, and the revolving speed of the fan is adjusted by changing a duty cycle of the voltage signal. The PWM voltage supply includes a time register, a digital pulse-width-modulation signal generator, and a signal converting circuit. The time register is used for storing therein a time unit for once pulse width modulation. The digital pulse-width-modulation signal generator is electrically connected to the temperature comparator and the time register for outputting a digital pulse-width-modulation signal, a duty cycle of which is changed in a predetermined manner in response to the triggering signal and the time unit. The signal converting circuit is electrically connected to the digital pulse-width-modulation signal generator and the fan for converting the digital pulse-width-modulation signal into the voltage signal to be provided for the fan.

Furthermore, the digital pulse-width-modulation signal generator includes an up/down counter, a cyclic counter, and a digital comparator. The up/down counter is electrically connected to the temperature comparator, and accumulatively counts upwards or downwards in response to the triggering signal. The cyclic counter is electrically connected to the time register, and counts a cycle in each the time unit. The digital comparator is electrically connected to the up/down counter and the cyclic counter, and compares counting values of the up/down counter and the cyclic counter in order that the digital pulse-width-modulation signal is kept in a high voltage state when a counting value of the up/down counter is no less than that of the cyclic counter, and kept in a low voltage state when a counting value of the up/down counter is less than that of the cyclic counter, thereby determining the duty cycle of the digital pulse-width-modulation signal.

In a preferred embodiment of the present device, the power supply is a level-adjustable voltage supply, by which a voltage signal is provided to revolve the fan, and the revolving speed of the fan is adjusted by changing a level of the voltage signal. The level-adjustable voltage supply includes a time register for storing therein a time unit for once voltage level adjustment, and a digital/analog converter electrically connected to the time register, the temperature comparator, and the fan for outputting a voltage signal, a level of which is changed in a predetermined manner in response to the triggering signal and the time unit.

For all aspects of the present invention, the electronic apparatus can be a personal computer.

BRIEF DESCRIPTION OF THE DRAWING

The present invention may best be understood through the following description with reference to the accompanying drawings, in which.

DETAILED DESCRIPTION OF THE PREFERRED EMBODIMENT

The present invention will now be described more specifically with reference to the following embodiments which are presented herein for purpose of illustration and description only.

Figure 1:
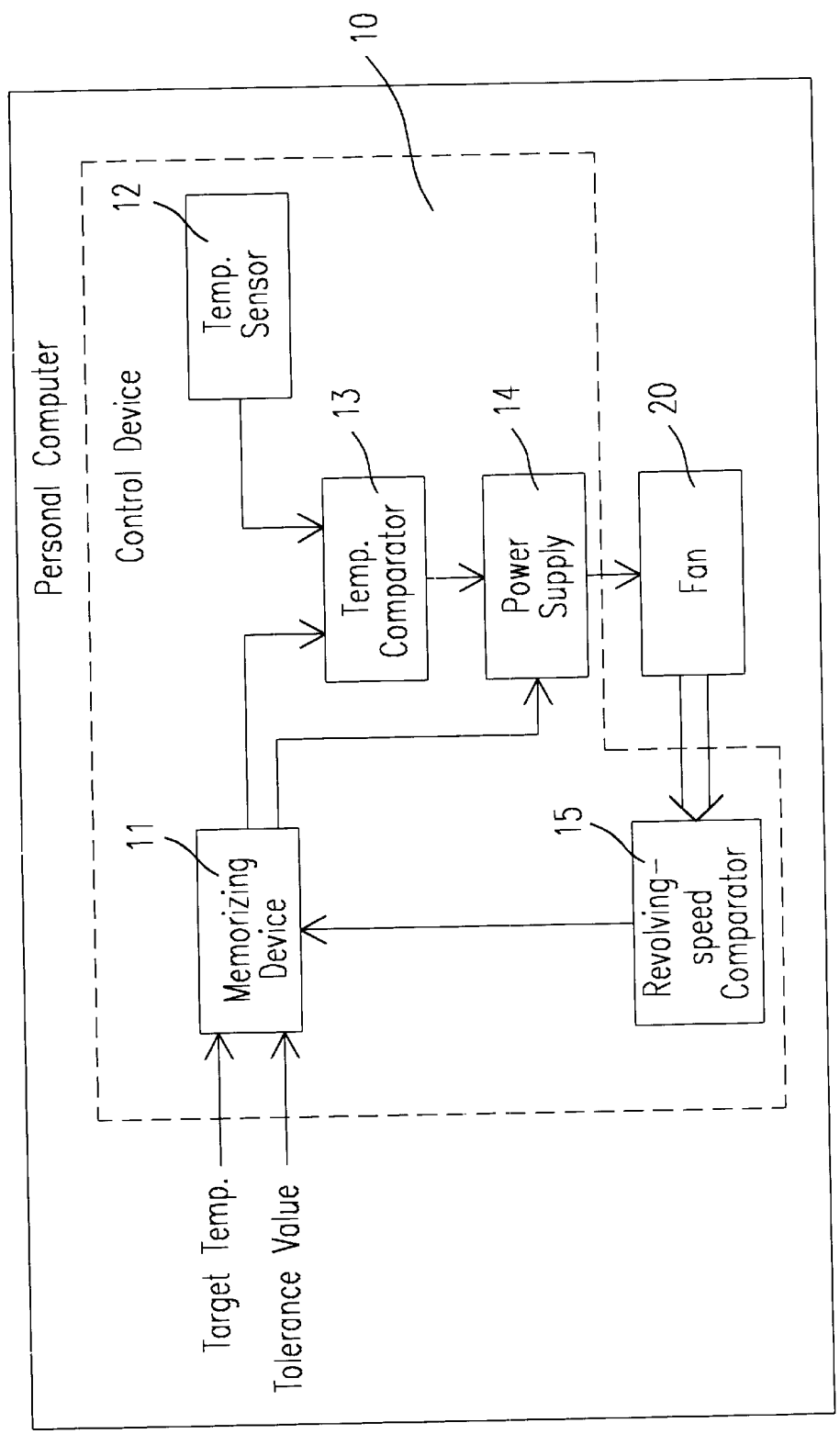
FIG. 1 is a schematic block diagram showing a preferred embodiment of a device for controlling a revolving speed of a heat-dissipating fan according to the present invention.

Please refer to FIG. 1 which is a schematic block diagram showing a preferred embodiment of a device for controlling a revolving speed of a heat-dissipating fan according to the present invention. The fan 20 and this control device 10 are mounted to a personal computer (PC) 1, and the fan 20 revolves under the control of the device 10 for flexibly dissipating heat generated during the operation of the personal computer 1. The control device 10 includes a memorizing device 11, a temperature sensor 12, a temperature comparator 13, a power supply 14, and a revolving-speed comparator 15. The electrically connecting relationship among these elements is shown in the figure.

Figure 2:
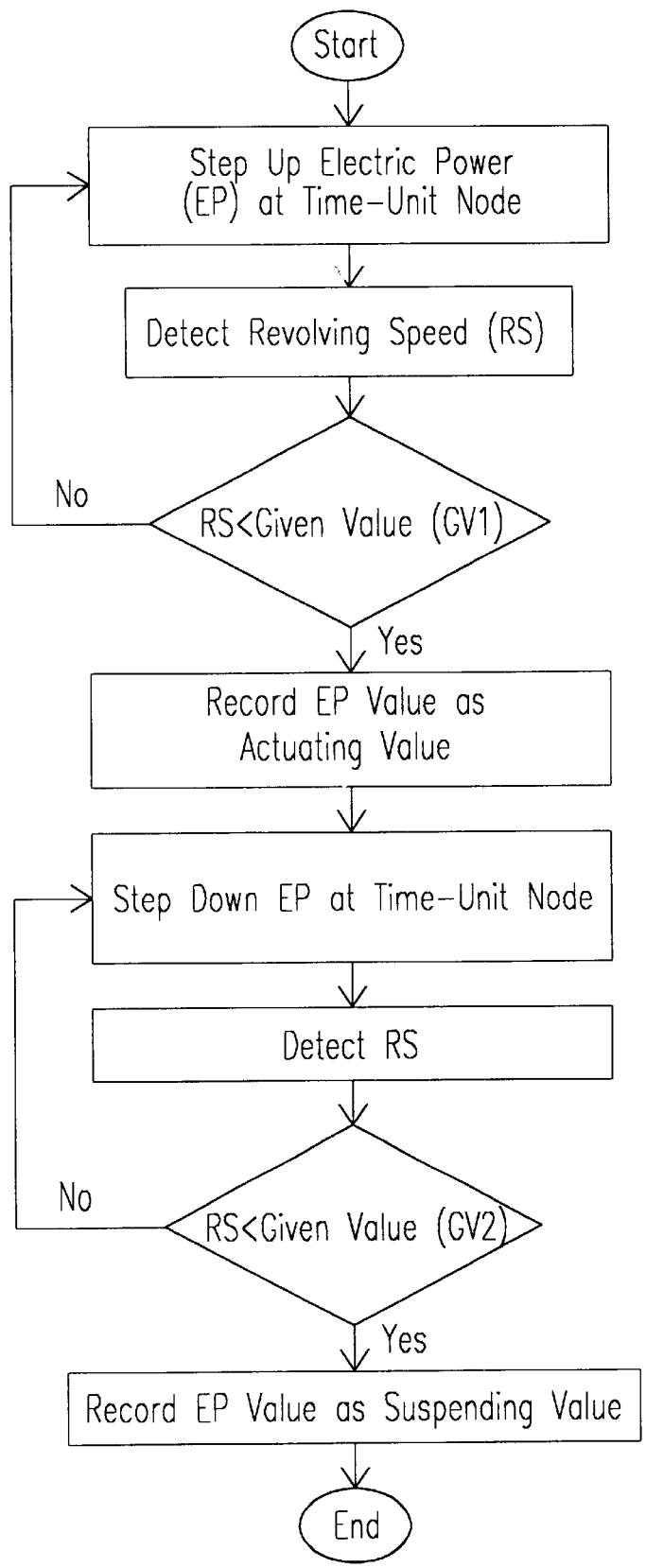
FIG. 2 is a simple flow chart showing a learning procedure of a method for controlling a revolving speed of a heat-dissipating fan according to the present invention.

Owing to various specifications and varying conditions of fans 20, the control device 10 preferably conducts a learning procedure to determine an actuating value and a suspending value of electric power provided for the fan in order to properly actuate and stop the fan efficiently when a new fan is used and/or a new power-on operation is performed. For the learning procedure with reference to the flow chart of FIG. 2, the power supply 14 provides electric power for the fan 20, and increases the electric power in a predetermined ratio at predetermined intervals, for example 1% increase per 1 second, to revolve the fan from a motionless state. Each of the intervals is referred to as a "time unit" for power adjustment once. It is understood that the revolving speed of the fan will be increased with the stepping-up electric power. When the revolving-speed comparator 15 determines that the revolving speed of the fan gets higher and higher and finally exceeds a given value, the corresponding value of the electric power will be determined as the actuating value, i.e. the electric power value considered to enable the fan to revolve, and recorded in the memorizing device 11. The memorizing device 11 can be a memory of the personal computer 1 or independent memory or registers. On the other hand, the electric power supplied to the fan 20 from the power supply 14 is stepped down according to the time units. The revolving speed of the fan will be decreased with the stepping-down electric power. When the revolving speed of the fan is determined to get lower and lower and become down to another given value by the revolving-speed comparator 15, the corresponding value of the electric power will be determined as the suspending value i.e. the electric power value considered to enable the fan to stop. By conducting the learning procedure as above, the actuation and/or the suspension of revolution of the fan can be accelerated so as to make the fan relatively sensitive to the control of the present device.

Figure 3:
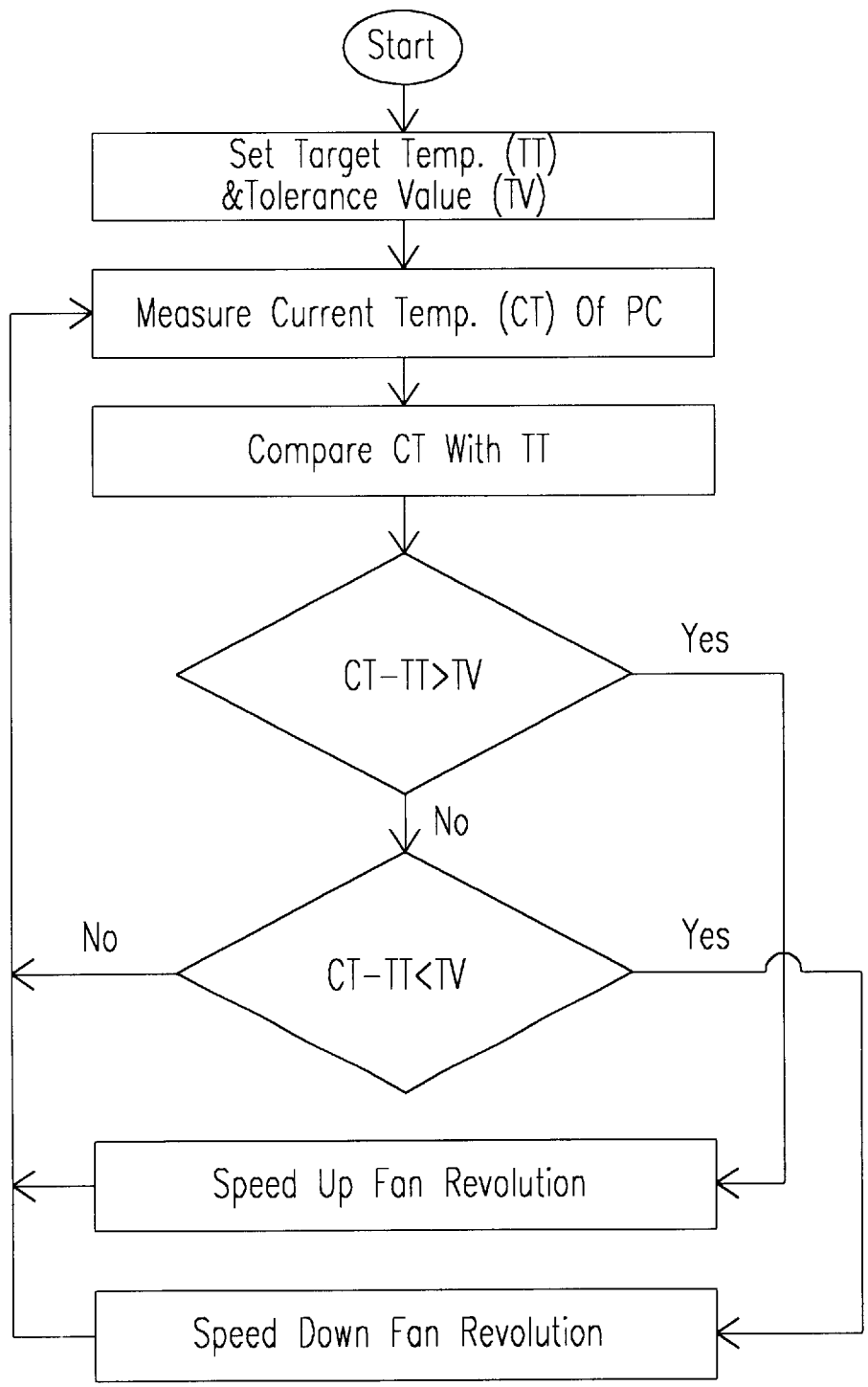
FIG. 3 is a simple flow chart showing a controlling procedure of a method for controlling a revolving speed of a heat-dissipating fan according to the present invention.

After the personal computer 1 begins to work, more and more heat will be generated so that the temperature of the system will increase gradually. Meanwhile, the control device 10 adjusts the electric power supplied to the fan so as to control the revolving speed of the fan according to the situation of the temperature variation in a manner described as follows with reference to FIGS. 1 and 3.

First of all, a target temperature is set according to the practical consideration. In practice, a tolerance value is also set to define the acceptable error range from the target temperature. The value of the target temperature and the tolerance value are stored in the memorizing device 11. The temperature sensor 12, which can be a thermistor, a transistor or a thermal diode, measures a current temperature of the personal computer 1 in operation. The temperature comparator 13 compares the current temperature with the target temperature. If the current temperature minus the target temperature is greater than the tolerance value, it means the revolution of the fan should speed up to promote heat dissipation capacity. On the contrary, if the current temperature minus the target temperature is less than the tolerance value, it means the revolution of the fan can speed down to economize electricity and lower noise. The temperature comparator 13 then sends out a triggering signal according to the comparing result.

Figure 7:
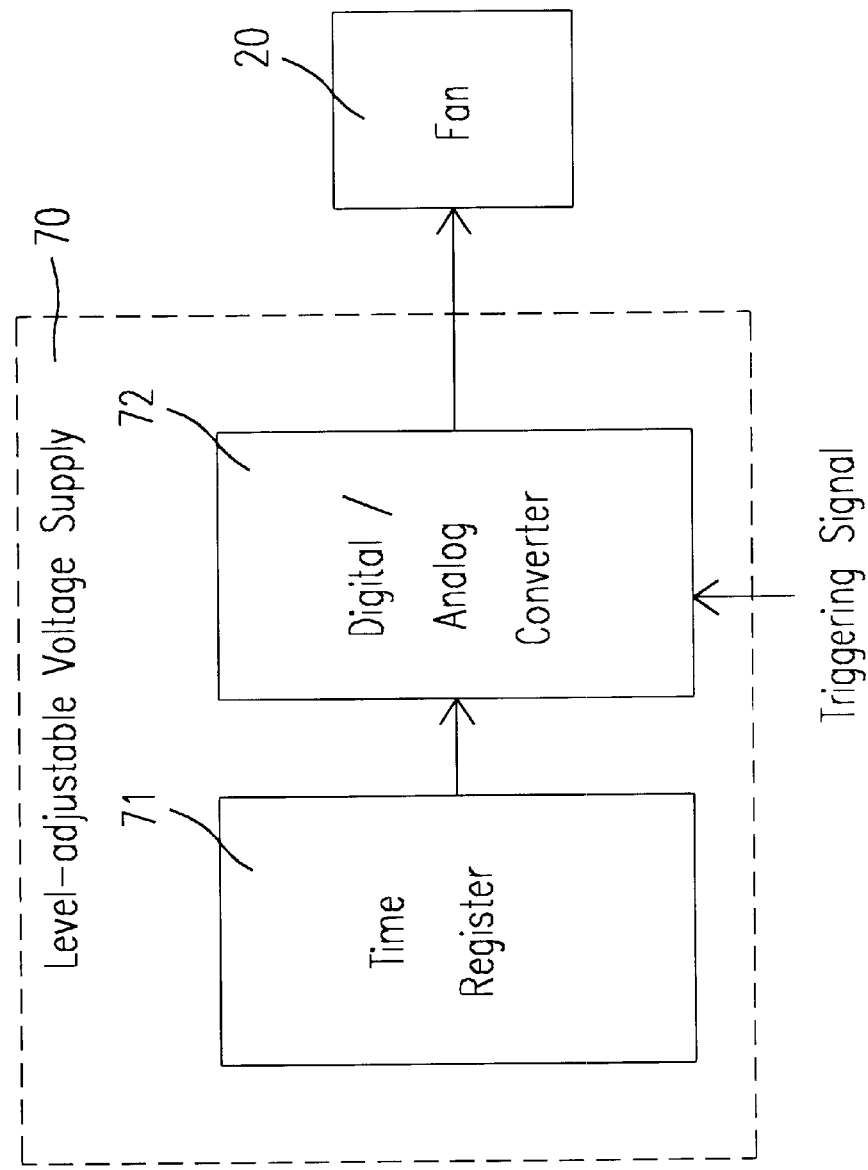
FIG. 7 is a schematic block diagram showing a preferred embodiment of a level-adjustable voltage supply serving as the power supply 14 used in the control device of FIG. 1.

The power supply 14 changes the electric power supplied to the fan 20 in response to the triggering signal, and outputs the changed electric power to the fan according to the time units. By this way, the temperature of the system can be precisely and adequately controlled around the target temperature. In order to exhibit the above functions, the power supply 14, for example, can be a pulse-width-modulation (PWM) voltage supply as shown in FIG. 4, or a level-adjustable voltage supply as shown in FIG. 7.

Figure 4:
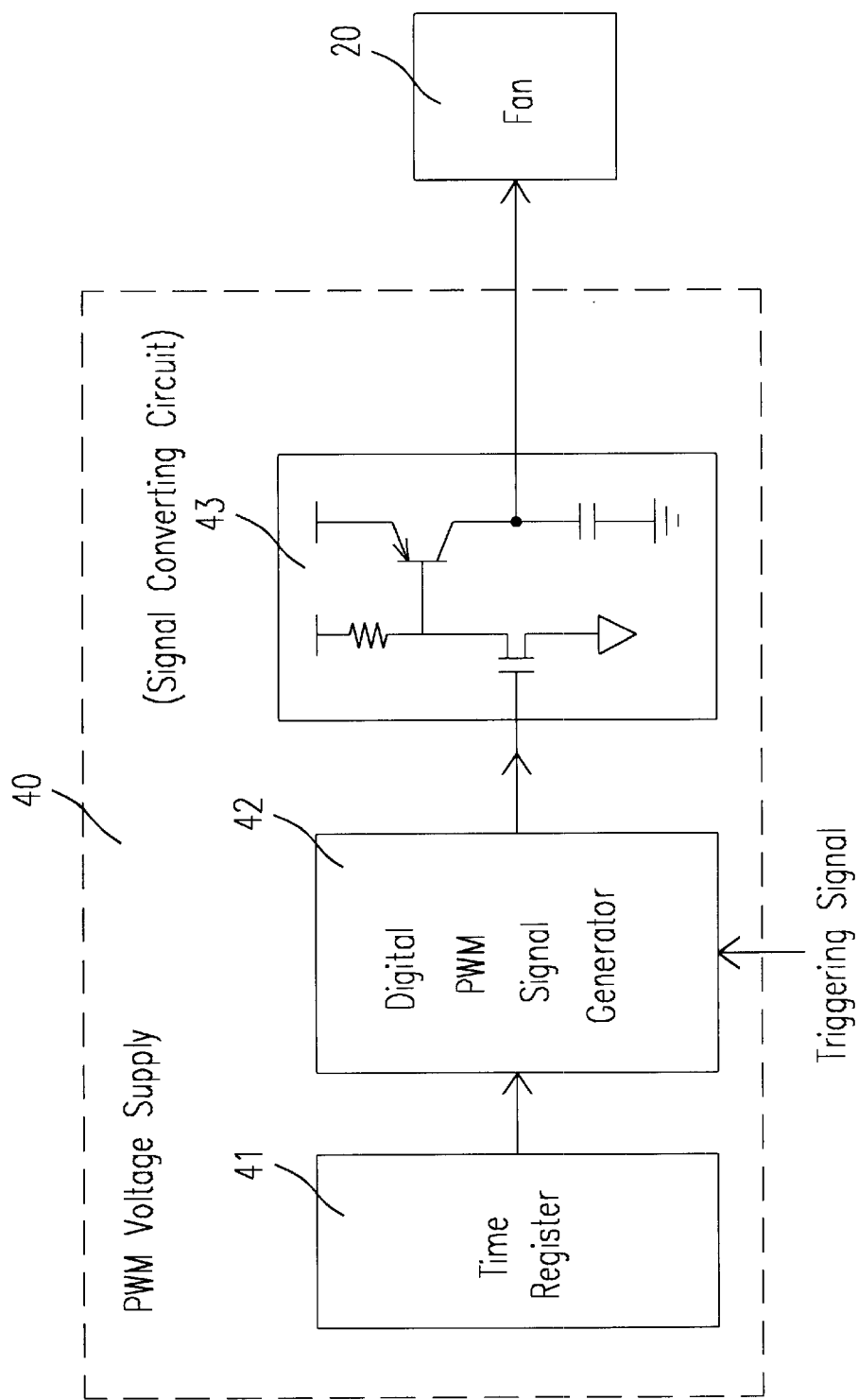
FIG. 4 is a schematic block diagram showing a PWM power supply 40 serving as the power supply 14 used in the control device of FIG. 1.
Figure 6:
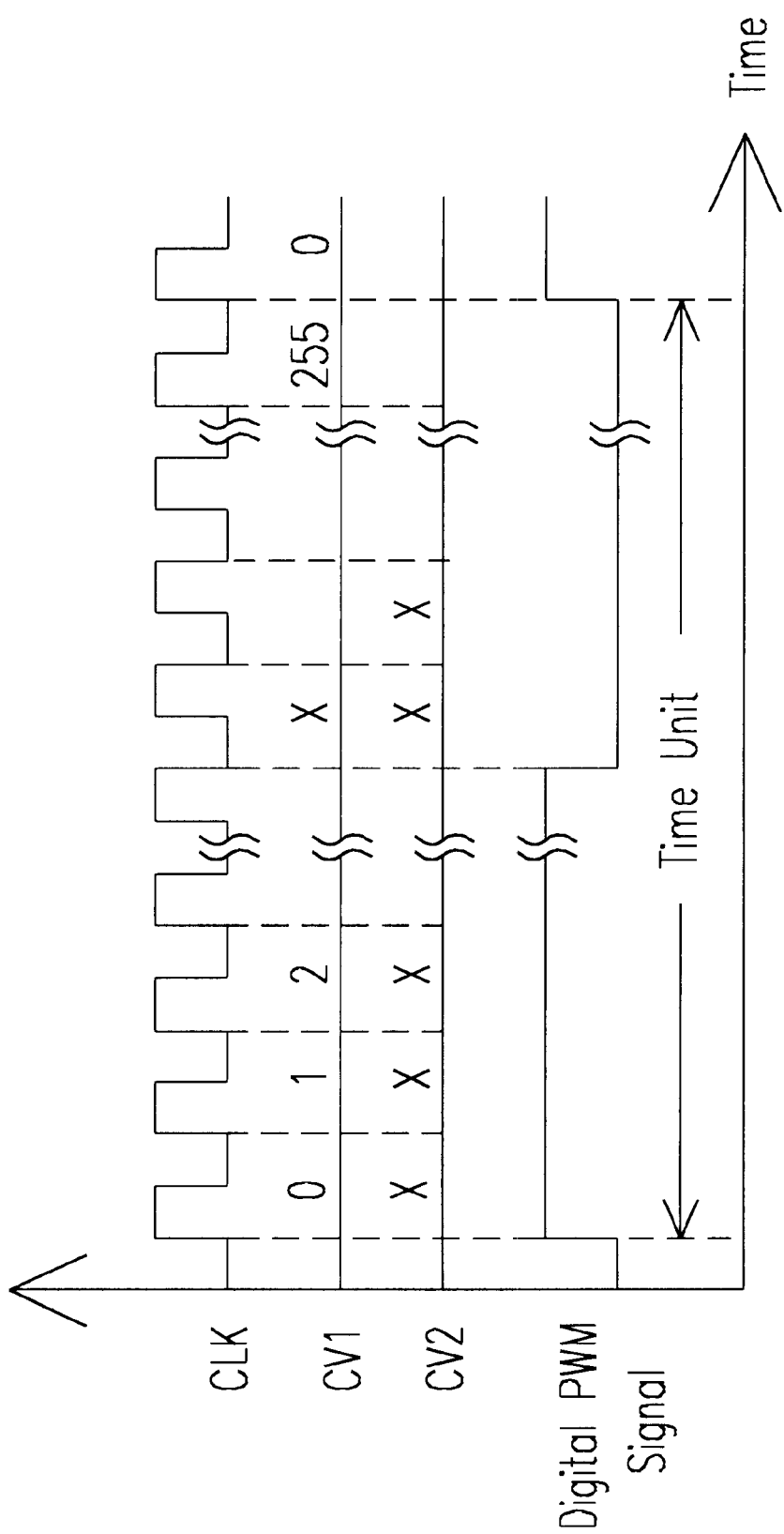
FIG. 6 is a time-sequence plot schematically showing the operation of the digital PWM generator of FIG. 5, and the determination of the duty cycle of the digital PWM signal.

Please now refer to FIG. 4 which is a schematic block diagram showing the PWM voltage supply 40. The PWM voltage supply 40 includes a time register 41, a digital pulse-width-modulation (PWM) signal generator 42, and a signal converting circuit 43. The time register 41 is used to store the time unit mentioned above for power change once, herein for pulse width modulation once. The digital PWM signal generator 42 is electrically connected to the temperature comparator 13 and the time register 41 for outputting a digital pulse-width-modulation (PWM) signal. The duty cycle of the PWM signal is changed in a manner which will be described later with reference to FIG. 6 in response to the triggering signal and the time unit. The signal converting circuit 43 is electrically connected to the digital PWM signal generator 42 and the fan 20 for converting the digital PWM signal into a voltage signal to be provided for the fan 20.

Figure 5:
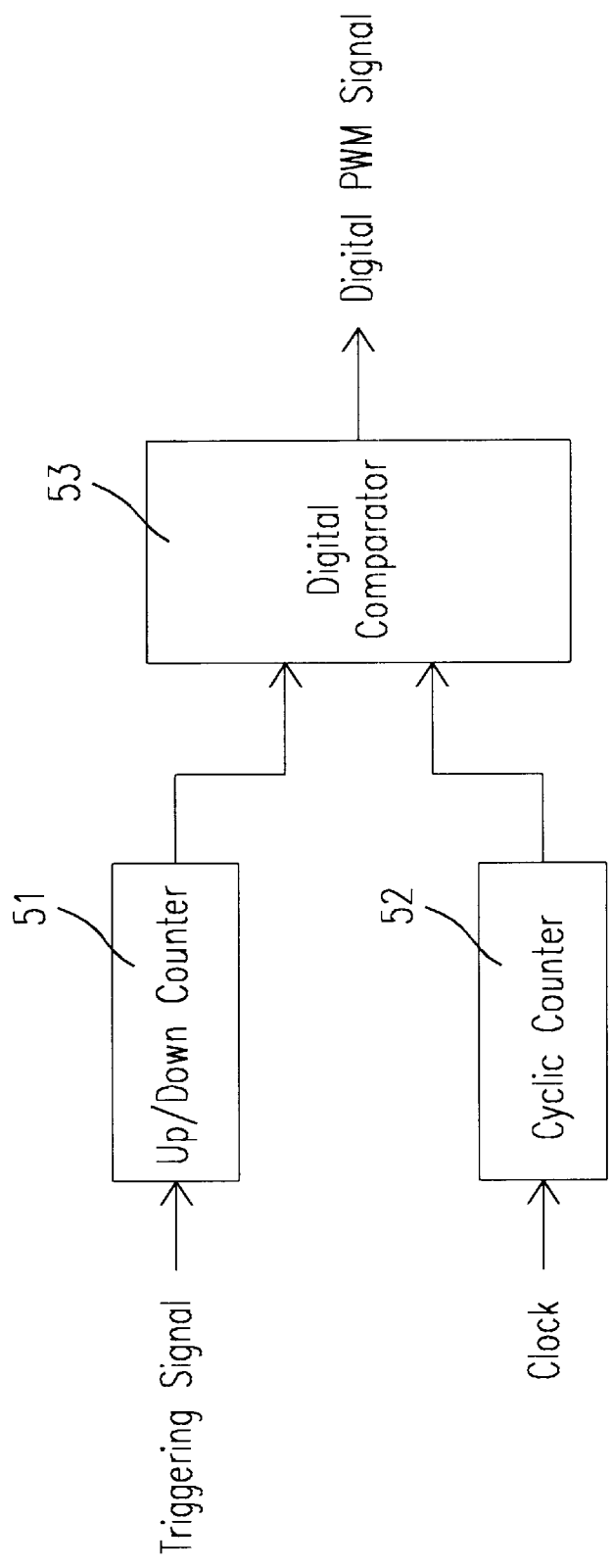
FIG. 5 is a schematic block diagram showing a preferred embodiment of a digital PWM generator 52 of the PWM power supply 40 of FIG. 4.

Please refer to FIG. 5 which is a schematic block diagram showing a preferred embodiment of the digital PWM signal generator 42 of FIG. 4. The digital PWM signal generator includes an up/down counter 51 which is electrically connected to the temperature comparator 13, a cyclic counter 52 which is electrically connected to the time register 41, and a digital comparator 53 which is electrically connected to the up/down counter 51 and the cyclic counter 52. The up/down counter 51 accumulatively counts upwards or downwards in response to the triggering signal, the cyclic counter 52 counts a cycle within each time unit in response to a clock (CLK), and the digital comparator 53 compares the counting value (CV1) of the cyclic counter and the counting value (CV2) of the up/down counter in order that the digital PWM signal is kept in a high voltage state when the counting value of the up/down counter is no less than that of the cyclic counter, and kept in a low voltage state when the counting value of the up/down counter is less than that of the cyclic counter. The duty cycle of the digital PWM signal is accordingly determined.

In order to further illustrate the method for controlling the revolving speed of the heat-dissipating fan by adjusting the duty cycle of the voltage signal supplied to the fan, an example is given here. First of all, the determination and calculation of the duty cycle is described with reference to FIG. 6. It is assumed that the time unit for power change once is 1 second, the cycle of the counting value CV1 for the cyclic counter 52 is from 0 to 255 (i.e. 8 bits), and the counting value CV2 of the up/down counter 51 is X at a certain time point the duty cycle to be determined. The cyclic counter 52 counts from 0 to 255 within the 1-second time unit, and keeps on counting another 0~255 in next 1-second time unit (not shown). On the other hand, the up/down counter remains at the counting value of X until it is triggered by the triggering signal which is sent out when the current temperature is higher or lower than the target temperature to an extent. At this time, the digital comparator 53 compares the counting values CV1 and CV2 in response to the clock (CLK). For the comparing result that CV2 is no less than CV1, the digital PWM signal is kept in a high voltage state, and on the contrary, for the comparing result that CV2 is less than CV1, the digital PWM signal is kept in a low voltage state. Accordingly, the duty cycle of the digital PWM signal will be (X/256)×100%. Furthermore, whenever the triggering signal is outputted to indicate a situation that the current temperature is relatively high, the counting value CV2 will be accumulatively decreased by one to become (X−1). At this time, the duty cycle of the digital PWM signal will be changed into (X−1)/256. On the contrary, if the triggering signal is outputted to indicate a situation that the current temperature is relatively low, the counting value CV2 will be accumulatively increased by one to become (X+1). At this time, the duty cycle of the digital PWM signal will be changed into (X+1)/256. By this way, the voltage supplied to the fan can be regulated to control the revolving speed of the fan.

Alternatively, a level-adjustable voltage supply as shown in FIG. 7 can be used as the power supply. The level-adjustable voltage supply 70 includes a time register 71 for storing therein a time unit for once voltage level adjustment, and a digital/analog converter 72 electrically connected to the time register 71, the temperature comparator 13, and the fan 20 for outputting a voltage signal. When the triggering signal is sent out on the condition that the current temperature is higher or lower than the target temperature to an extent, the digital/analog converter 72 respectively decreases or increases the level of the voltage signal supplied to the fan by a certain value, e.g. 0.1 volt, at an immediate time-unit node. It is to be noted that the term "node" used herein means the point that two periods of time units meet. By this way, the voltage supplied to the fan can be regulated to control the revolving speed of the fan.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for controlling a revolving speed of a heat-dissipating fan, said fan being mounted to an electronic apparatus and revolving for dissipating heat generated during the operation of said electronic apparatus, said method comprising steps of:

predetermining a target temperature and a tolerance value;

performing a temperature-measuring step of measuring a current temperature of said electronic apparatus in operation;

performing a temperature-comparing step of comparing said current temperature with said target temperature;

performing a selective signal-output step of outputting a triggering signal to change the revolution of said fan when a difference between said current temperature and said target temperature is greater than said tolerance value; and respectively determining an actuating value of an electric power supplied to said fan to actuate the revolution of said fan and a suspending value of said electric power to stop the revolution of said fan, comprising steps of:

providing an electric power for said fan in a motionless state;

intermittently stepping up said electric power to revolve said fan, and detecting a revolving speed of said fan at each power-change step;

determining a first threshold value of said electric power making said revolving speed of said fan exceed a first given value as said actuating value;

intermittently stepping down said electric power provided for said fan in a motional state, and detecting a revolving speed of said fan at each power-change step; and determining a second threshold value of said electric power making said revolving speed of said fan lower than a second given value as said suspending value.

2. The method according to claim 1 wherein said temperature-measuring step, said temperature-comparing step, and said selective signal-output step are repeated at predetermined intervals.

3. The method according to claim 1 wherein in said selective signal-output step, said triggering signal triggers an increase of an electric power supplied to said fan so as to speed up the revolution of said fan when said current temperature is less than said target temperature at least by said tolerance value.

4. The method according to claim 3 wherein in said selective signal-output step, said triggering signal triggers a decrease of said electric power supplied to said fan so as to speed down the revolution of said fan when said current temperature is greater than said target temperature at least by said tolerance value.

5. A method for controlling a revolving speed of a heat-dissipating fan, said fan being mounted to an electronic apparatus and revolving for dissipating heat generated during the operation of said electronic apparatus, said method comprising steps of:

predetermining a target temperature and a tolerance value;

performing a temperature-measuring step of measuring a current temperature of said electronic apparatus in operation;

performing a temperature-comparing step of comparing said current temperature with said target temperature;

performing a selective signal-output step of outputting a triggering signal to speed up the revolution of said fan when said current temperature is less than said target temperature at least by said tolerance value, and outputting a triggering signal to speed down the revolution of said fan when said current temperature is greater than said target temperature at least by said tolerance value;

repeating said temperature-measuring step, said temperature-comparing step, and said selective signal-output step at predetermined intervals; and determining an actuating value of an electric power supplied to said fan to actuate the revolution of said fan, comprising steps of:

providing an electric power for said fan in a motionless state;

intermittently stepping up said electric power to revolve said fan, and detecting a revolving speed of said fan at each power-change step; and determining a first threshold value of said electric power making said revolving speed of said fan exceed a first given value as said actuating value.

6. The method according to claim 5 wherein in said selective signal-output step, said triggering signal triggers an increase or a decrease of an electric power supplied to said fan so as to speed up or speed down the revolution of said fan, respectively.

7. The method according to claim 6 wherein said increase and said decrease of said electric power are performed by changing a duty cycle of a voltage signal supplied to said fan.

8. The method according to claim 6 wherein said increase and said decrease of said electric power are performed by changing a level of a voltage supplied to said fan.

9. The method according to claim 5 further comprising the following steps to determine a suspending value of said electric power to stop the revolution of said fan:

intermittently stepping down said electric power provided for said fan in a motional state, and detecting a revolving speed of said fan at each power-change step; and determining a second threshold value of said electric power making said revolving speed of said fan lower than a second given value as said suspending value.

10. A device for controlling a revolving speed of a heat-dissipating fan, said fan being mounted to an electronic apparatus and revolving for dissipating heat generated during the operation of said electronic apparatus, said device comprising:

a temperature sensor for measuring a current temperature of said electronic apparatus in operation;

a temperature comparator electrically connected to said thermometer for comparing said current temperature with a predetermined target temperature, and outputting a triggering signal if said current temperature is beyond a tolerance value from said predetermined target temperature;

a power supply electrically connected to said temperature comparator and said fan for providing an electric power for said fan to make said fan revolve, and changing a value of said electric power in response to said triggering signal to regulate a revolving speed of said fan; and a revolving-speed comparator for comparing revolving speeds of said fan detected under different electric powers in a learning procedure to determine an actuating value and/or a suspending value of said electric power to actuate and/or stop the revolution of said fan, respectively.

11. The device according to claim 10 wherein said temperature sensor is a thermistor.

12. The device according to claim 10 wherein said temperature sensor is a transistor.

13. The device according to claim 10 wherein said temperature sensor is a thermal diode.

14. The device according to claim 10 wherein said power supply increases said value of said electric power in response to said triggering signal so as to speed up the revolution of said fan when said current temperature is less than said target temperature at least by said tolerance value, and decreases said value of said electric power so as to speed down the revolution of said fan when said current temperature is greater than said target temperature at least by said tolerance value.

15. The device according to claim 14 further comprising a memorizing device for storing therein said predetermined target temperature and said tolerance value.

16. The device according to claim 14 wherein said learning procedure includes steps of:

provoking an electric power for said fan in a motionless state;

intermittently stepping up said electric power to revolve said fan, and detecting a revolving speed of said fan at each power-change step;

determining a first threshold value of said electric power making said revolving speed of said fan exceed a first given value as said actuating value;

intermittently stepping down said electric power provided for said fan in a motional state, and detecting a revolving speed of said fan at each power-change step; and determining a second threshold value of said electric power making said revolving speed of said fan lower than a second given value as said suspending value.

17. The device according to claim 16 further comprising a memorizing device for storing therein said predetermined target temperature, said tolerance value, said first given value, said second given value, said actuating value and said suspending value.

18. The device according to claim 10 wherein said power supply is a pulse-width-modulation, (PWM) voltage supply, by which a voltage signal is provided to revolve said fan, and said revolving speed of said fan is adjusted by changing a duty cycle of said voltage signal.

19. The device according to claim 18 wherein said PWM voltage supply includes:

a time register for storing therein a time unit for once pulse width modulation;

a digital pulse-width-modulation signal generator electrically connected to said temperature comparator and said time register for outputting a digital pulse-width-modulation signal, a duty cycle of which is changed in a predetermined manner in response to said triggering signal and said time unit; and a signal converting circuit electrically connected to said digital pulse-width-modulation signal generator and said fan for converting said digital pulse-width-modulation signal into said voltage signal to be provided for said fan.

20. The device according to claim 19 wherein said digital pulse-width-modulation signal generator includes:

an up/down counter electrically connected to said temperature comparator, and accumulatively counting upwards or downwards in response to said triggering signal;

a cyclic counter electrically connected to said time register, and counting a cycle in each said time unit; and a digital comparator electrically connected to said up/down counter and said cyclic counter, and comparing counting values of said up/down counter and said cyclic counter in order that said digital pulse-width-modulation signal is kept in a high voltage state when a counting value of said up/down counter is no less than that of said cyclic counter, and kept in a low voltage state when a counting value of said up/down counter is less than that of said cyclic counter, thereby determining said duty cycle of said digital pulse-width-modulation signal.

21. The device according to claim 10 wherein said power supply is a level-adjustable voltage supply, by which a voltage signal is provided to revolve said fan, and said revolving speed of said fan is adjusted by changing a level of said voltage signal.

22. The device according to claim 21 wherein said level-adjustable voltage supply includes:

a time register for storing therein a time unit for once voltage level adjustment; and a digital/analog converter electrically connected to said time register, said temperature comparator, and said fan for outputting a voltage signal, a level of which is changed in a predetermined manner in response to said triggering signal and said time unit.

23. The device according to claim 10 wherein said electronic apparatus is a personal computer.

* * * * *